United States Patent
Iwamatsu

[11] Patent Number: 5,142,640
[45] Date of Patent: Aug. 25, 1992

[54] TRENCH GATE METAL OXIDE SEMICONDUCTOR FIELD EFFECT TRANSISTOR

[75] Inventor: Seiichi Iwamatsu, Nagano, Japan
[73] Assignee: Seiko Epson Corporation, Tokyo, Japan
[21] Appl. No.: 360,486
[22] Filed: Jun. 2, 1989

[30] Foreign Application Priority Data

| Jun. 2, 1988 | [JP] | Japan | 63-135971 |
| Jul. 12, 1988 | [JP] | Japan | 63-174125 |
| Jul. 12, 1988 | [JP] | Japan | 63-174126 |
| Jul. 12, 1988 | [JP] | Japan | 63-174127 |
| Jul. 12, 1988 | [JP] | Japan | 63-174128 |

[51] Int. Cl.$^5$ .................. H01L 29/78; H01L 27/12
[52] U.S. Cl. .................. 357/23.6; 357/49; 357/59
[58] Field of Search .................. 357/23.6, 49, 59, 23.4

[56] References Cited

U.S. PATENT DOCUMENTS

| 4,486,942 | 12/1984 | Hirao | 29/571 |
| 4,717,941 | 1/1988 | Yamazaki | 357/23.3 |
| 4,721,987 | 1/1988 | Baglee et al. | 357/23.6 |
| 4,774,556 | 9/1988 | Fujii et al. | 357/23.5 |
| 4,794,434 | 12/1988 | Pelley, III | 357/23.6 |
| 4,819,054 | 4/1989 | Kawaji | 357/49 |
| 4,835,586 | 5/1989 | Cogan et al. | 357/23.14 |

FOREIGN PATENT DOCUMENTS

| 59-48547 | 11/1984 | Japan | 357/23.6 |

Primary Examiner—Andrew J. James
Assistant Examiner—Stephen D. Meier
Attorney, Agent, or Firm—Spensley, Horn, Jubas & Lubitz

[57] ABSTRACT

A trench gate MOS FET having one of the following features: a drain diffusion layer and/or a source diffusion layer having a two-layer structure consisting of a high concentration layer and a low concentration layer; at least a drain diffusion layer having a low concentration layer adjacent to the semiconductor surface of a trench gate and a high concentration layer adjacent to the low concentration layer; a gate oxide film formed to have a greater thickness at the overlapping portion of the diffusion layer and the gate electrode than at the other portions thereof; two trench gates provided on the semiconductor surface so as to control the conductivity of a channel region between the trench gates; or a trench isolation region provided on the semiconductor substrate in contact with the trench gate.

3 Claims, 4 Drawing Sheets

TRENCH GATE METAL OXIDE SEMICONDUCTOR FIELD EFFECT TRANSISTOR

BACKGROUND OF THE INVENTION

1. Field of the Invention

The present invention relates to trench gate MOS FET structures having a diffusion layer, a gate oxide film, a gate and an isolation.

2. Description of the Prior Art

A conventional MOS FET has a structure such as that shown in FIG. 7. This is a conventional MOS FET fabricated by forming a field $SiO_2$ film 702, a gate $SiO_2$ film 703 and a gate electrode 704, a source impurity diffusion layer (hereinunder referred to as "source diffusion layer") 705, and a drain impurity diffusion layer 706 (hereinunder referred to as "drain diffusion layer") on the Si substrate 701, further forming a low concentration diffusion layer 707 which is in contact with at least the drain diffusion layer 706, and extending lead-out electrodes from the source diffusion layer 705, the gate electrode 704 and the drain diffusion layer 706 to provide a source S, a gate G and a drain D, respectively.

In contrast, a trench gate MOS FET such as that shown in FIG. 8 has recently been proposed. This MOS FET is generally fabricated by providing a field $SiO_2$ film 802 and a trench portion on an Si substrate 801, forming a gate $SiO_2$ film 803, a gate electrode 804, a source diffusion layer 805 and a drain diffusion layer 806 in the trench portion, and extending lead-out electrodes from the source diffusion layer 805, the gate electrode 804 and the drain diffusion layer 806 so as to form a source S, a gate G and a drain D, respectively.

Another proposal has been made by Yutaka Hayashi in "Ambition for High Integration in the Order of Giga Bit" (Science and Technique in Japan, 27, 242, pp. 46 to 47 (1986)). This MOS FET is called an X-MOS, and has a structure such as that shown in FIG. 9. More specifically, an X-MOS is fabricated by laminating, in the order stated, an interlayer dielectric film 913, a first gate electrode 904, a second gate $SiO_2$ film 903 and an Si substrate 901 consisting of a semiconductor Si film on the surface of a substrate 912 of a glass material or the like; then providing a source diffusion layer 905 and a drain diffusion layer 906 on the Si substrate 901; and further providing a second gate $SiO_2$ film 903' and a second gate electrode 904'.

Furthermore, the isolation of a device by trench isolation, the formation of a trench gate, etc., have conventionally been proposed independently of each other for a MOS FET.

In the prior art, however, it has never been suggested to form a low concentration diffusion layer which is adjacent to a drain diffusion layer with a view to preventing the generation of hot electrons in an MOS FET having what is called a trench gate structure. This is probably because it is considered that since it is possible to keep the channel length of a trench long by making the depth of the trench sufficiently large in a trench gate structure, the generation of hot electrons can substantially be reduced with even a small gate length. Even in such a trench gate MOS FET, however, a great effort has been made to make the trench depth as small as possible. If the trench depth is made too small, however, hot electrons are produced due to the enhancement of the field strength in the vicinity of the drain, which leads to fluctuations in threshold value, thereby disadvantageously reducing long term reliability.

In a conventional trench gate MOS FET as shown in FIG. 8, the gate $SiO_2$ film 803 and the gate electrode 804 are formed in the trench portion provided on the surface of the Si substrate 801, and the thickness of the portion of oxide film 803 which overlaps gate electrode 804 is generally the same on the surface of the source diffusion layer 805 and the drain diffusion layer 806 as the thickness of the other portion of film 803. This structure is disadvantageous in that the electric capacitance at the overlapping portion of the gate electrode overlaps and the diffusion layer increases, thereby lowering the switching speed of the trench gate MOS FET device.

In the prior art device shown in FIG. 9, it is necessary to adopt a multi-layer structure and it is difficult to form a semiconductor film without producing a crystal defect which may result in an increase in the leakage current in the device characteristics.

Furthermore, in a conventional MOS FET having a trench gate structure, although there is no particular problem in the structure in the lengthwise direction of the gate, the gate width does not have a defined, or reproducible, value due to an indefinite relationship with the isolation portion.

SUMMARY OF THE INVENTION

Accordingly, it is an object of the present invention to eliminate the above-described problems in the prior art.

A first specific object of the present invention is to improve the structure of a drain diffusion layer in a trench gate MOS FET.

It is a second specific object of the present invention to provide a novel structure for a gate oxide film in a trench gate MOS FET.

It is a third specific object of the present invention to provide a field effect transistor structure for controlling the channel layer between two trench gates by using a single crystal semiconductor substrate.

It is a fourth specific object of the present invention to provide a novel structure of a trench gate MOS FET which can be given a defined gate width.

To achieve this aim, the present invention provides trench gate MOS FETs which are characterized in that:

(1) a drain diffusion layer and/or a source diffusion layer has a two-layer structure consisting of a high concentration layer and a low concentration layer, (2) at least a drain diffusion layer is so composed as to have a low concentration layer adjacent to the semiconductor surface of a trench gate and a high concentration layer adjacent to the low concentration layer, (3) in a trench gate MOS FET, a gate oxide film is so composed as to have a larger thickness at the overlapping portion of the diffusion layer and the gate electrode than at the other portion, (4) a field effect transistor includes two trench gates provided on the semiconductor surface so as to control the conductivity of the channel region between the trench gates, and (5) a trench isolation region is provided on a semiconductor substrate and a trench gate is provided in contact with the trench isolation region.

The above and other objects, features and advantages of the present invention will become clear from the following description of the preferred embodiments thereof, taken in conjunction with the accompanying drawings.

DESCRIPTION OF THE PREFERRED EMBODIMENTS

The present invention will be explained with reference to the embodiments shown in FIGS. 1 to 6.

Figure 1:
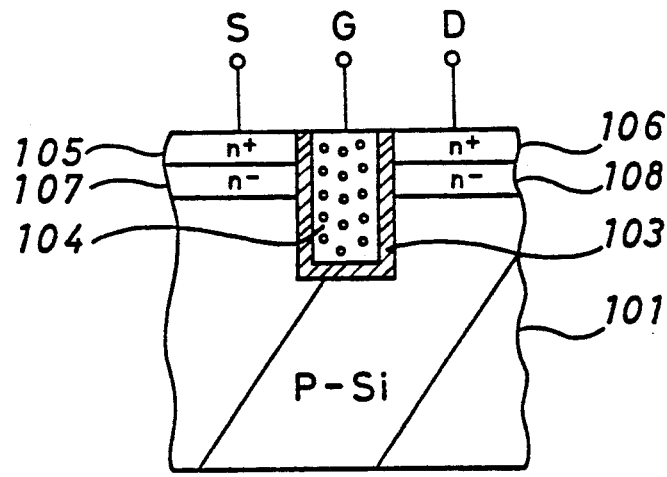
FIGS. 1 to 5 are cross-sectional views of the main part of embodiments of trench gate MOS FETs according to the present invention.

Referring first to FIG. 1, an Si substrate 101 is etched, for example by dry etching, from the surface to a depth of 0.5 $\mu$m to form a trench 0.1 $\mu$m wide. An SiO$_2$ gate film 103 is formed to a thickness of 50 to 100 Å on the side and bottom walls of the trench and a gate electrode 104 composed of polycrystalline Si or the like is formed on the surface of the SiO$_2$ gate film by CVD, thereby producing a gate. Thereafter, n-layers 107 and 108 having a low concentration are formed on the source and drain regions to a thickness of 0.2 $\mu$m by implanting phosphorus ions or arsenic ions, and n+ layers 105 and 106 having a high concentration are then formed to a thickness of 0.1 $\mu$m by implanting phosphorus ions or arsenic ions, thereby producing a source S and a drain D, respectively.

In the case of forming the n− layer only on the drain side, the source region can be masked by a photoresist during the ion implantation. It is also possible to form the n+ layers 105 and 106 before providing the trench and to then isolate the source and drain by forming the trench. In this case, it is also possible to form the SiO$_2$ gate film 103 and the gate electrode 104 after forming the trench.

An advantage of this method is that it makes possible the reduction of the dimension of a device because the n+ layers 105 and 106 and the n− layers 107 and 108 can be formed between the trench isolation and the trench gate by combining this method with trench isolation.

It is self-evident that this method is applicable not only to an Si semiconductor but also to a semiconductor of a compound such as GaAs and InP, and that an Si$_3$N$_4$ film, a mixture film of SiO$_2$ and Si$_3$N$_4$, and a multi-layer film thereof as well as the SiO$_2$ film are usable as the gate film. The ion element implanted in the source region and the drain region is an element that is of a different conductivity type than the substrate. For example, when the substrate 101 is composed of an n-type Si, boron or the like is used as an ion element for the source and the drain. It is also possible to form an impurity layer of the same type as the source and the drain on the bottom surface of the trench gate.

Figure 2:
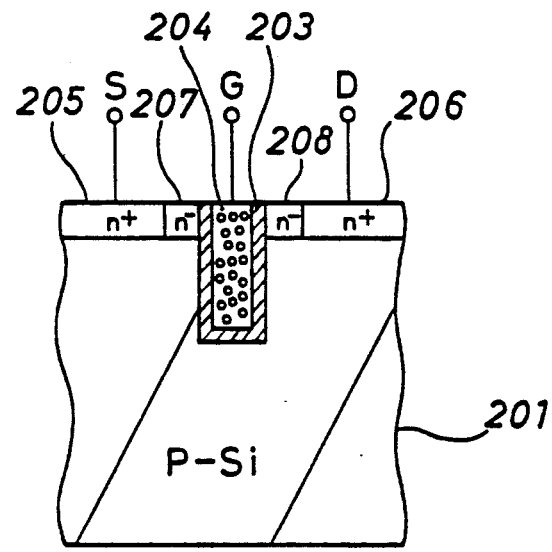

Referring to FIG. 2, a trench is formed on the surface of an Si substrate 201, and an SiO$_2$ gate film 203 and a gate electrode 204 are formed within the trench, thereby constituting a trench gate region. Low concentration diffusion layers 207 and 208 adjacent to the trench gate region on the surface of the Si substrate are formed by ion implantation or the like, and high concentration diffusion layers 205 and 206 which are to be the source and the drain are formed so as to be adjacent to the low concentration diffusion layers 207 and 208 by implanting ions while masking the low concentration diffusion layers 207 and 208. Additionally, either of the low concentration diffusion layers 207 and 208 is essential for the drain region but the source region can dispense with a low concentration diffusion layer.

Figure 3:
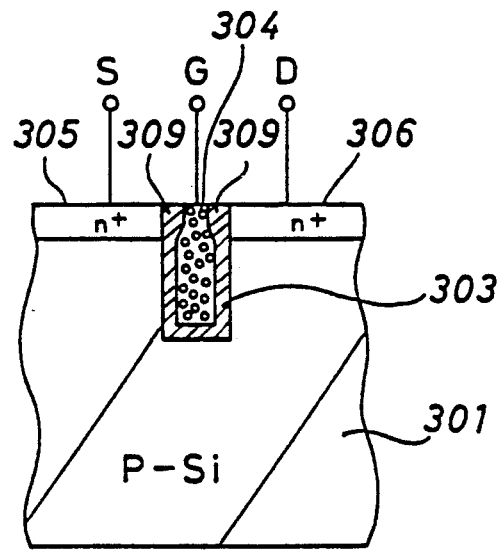

A trench gate MOS FET shown in FIG. 3 is fabricated in the following manner. A diffusion layer which will result in a source diffusion layer 305 and a drain diffusion layer 306, is first provided on the surface of an Si substrate 301 by ion implantation or the like. Thereafter, a trench is formed and on the side wall of the trench, and SiO$_2$ gate film at the regions 309 in contact with the diffusion layers 305 and 306 becomes larger than the rest of gate film 303 due to thermal oxidation, as shown in FIG. 3. At this time, a thick oxide film (not shown) is also formed on the surfaces of the diffusion layers 305 and 306. A gate electrode 304 composed of polycrystalline Si, TiN, N, W, WSi or the like is then embedded in the trench, thereby completing the MOSFET).

Figure 4:
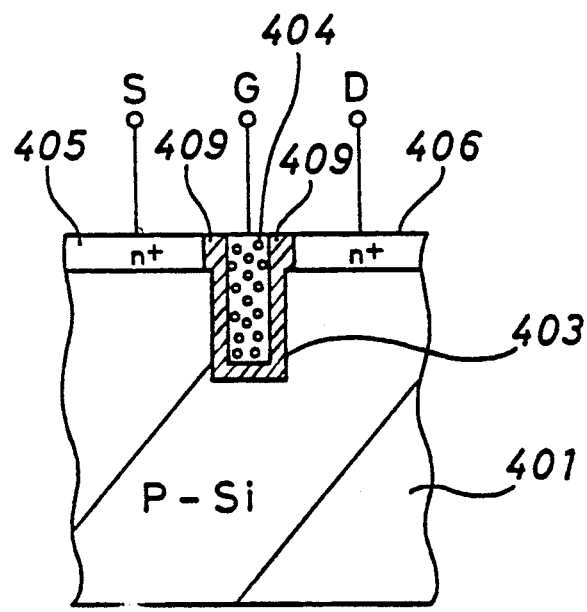

Referring to FIG. 4, after a diffusion layer composed of n+ polycrystalline Si formed over the entire surface of a p-type Si substrate 401, the diffusion layer and Si substrate 401 are etched to divide the diffusion layer into separate parts 405 and 406 and to form a trench in such a manner that the width of the trench is slightly larger at the level of diffusion layers 405 and 406. An SiO$_2$ oxide film 403 is formed on the side wall of the trench film 403 including a thickened portion 409 adjacent the edges of diffusion layers 405 and 406 by thermal oxidation, and a gate electrode 404 is then embedded in the trench by CVD. The oxide film is thicker at the portion 409 adjacent the diffusion layers than at the other portions.

Figure 5:
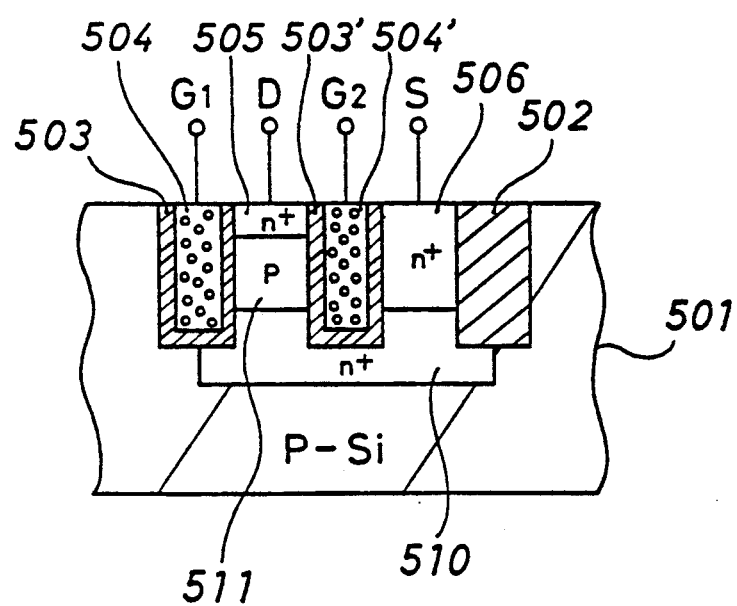

FIG. 5 shows another embodiment of an MOS FET according to the present invention. This embodiment has two trench gates. On the surface of an Si substrate 501, trench gates composed of first and second electrodes 504 and 504' and SiO$_2$ gate films 503, 503', respectively, and an isolation region 502 composed of a dielectric material such as SiO2 are formed. A p-type channel 511 extends between the two trench gates, and is sandwiched between a drain diffusion layer 505 and a buried diffusion layer 510 contiguous with a source diffusion layer 506 which are formed in substrate 501. As to the dimensions of the respective portions in this embodiment, for example, the width of channel 511, i.e., in the plane of FIG. 5 parallel to the upper surface of substrate 501, is not more than 0.1 $\mu$m, the length of channel 511, perpendicular to the upper surface of substrate 501, is about 0.02 $\mu$m, the width of the gates 504, 504' is not more than 0.1 $\mu$m, the depth thereof is not more than 0.3 $\mu$m, the thickness of each SiO$_2$ gate film 503, 503' is about 20 Å, and the depth of the diffusion layer 505 is not more than 0.1 $\mu$m. Isolation region 502 has dimensions similar to those of the trench gates; namely, the depth is not more than 0.3 $\mu$m and the width not more than 0.1 $\mu$m. These dimensions can be obtained by x-ray lithography, dry etching, diffusion or oxidation.

Figure 6A:
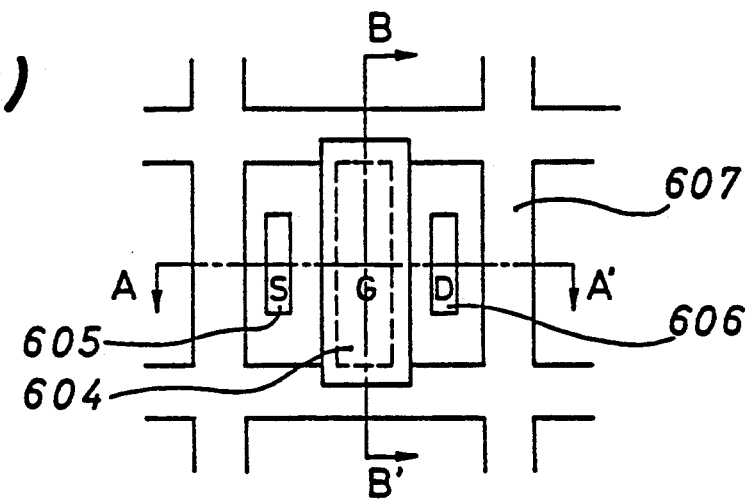
FIG. 6 is a plan view of a MOS FET according to the invention and FIGS. 6(b) and 6(c) are cross-sectional views along the correspondingly identified lines in FIG. 6(a).
Figure 6B:
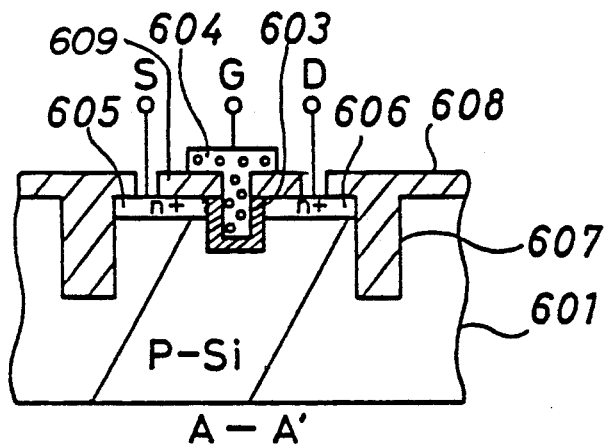
Figure 6C:
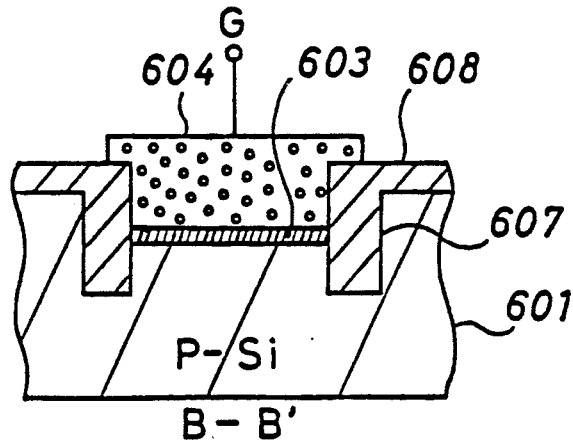
Figure 7:
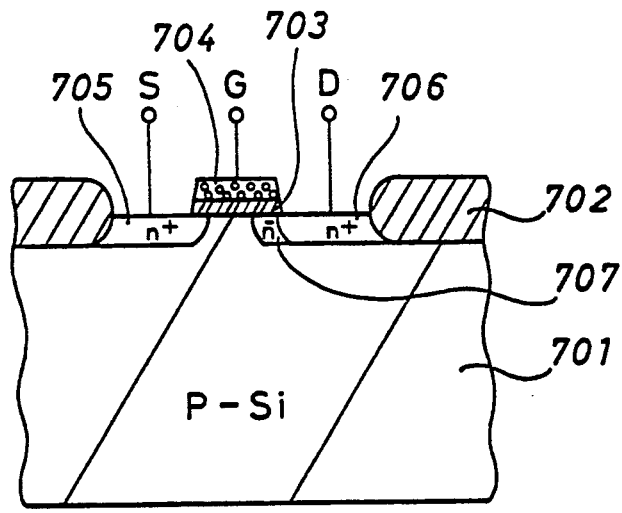
FIG. 7 is a cross-sectional view of a conventional MOS FET.
Figure 8:
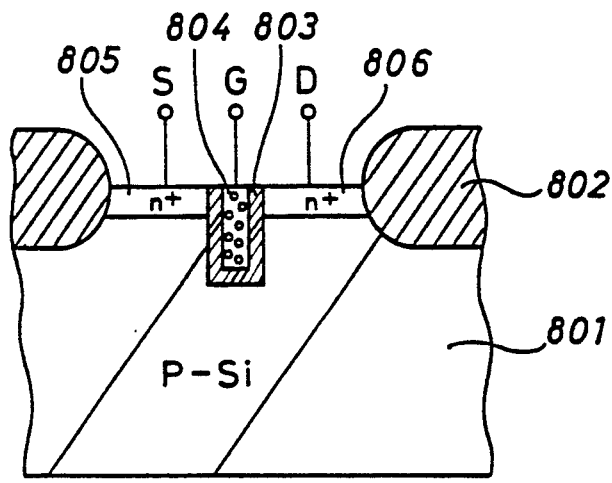
FIG. 8 is a cross-sectional view of a conventional trench gate MOS FET.
Figure 9:
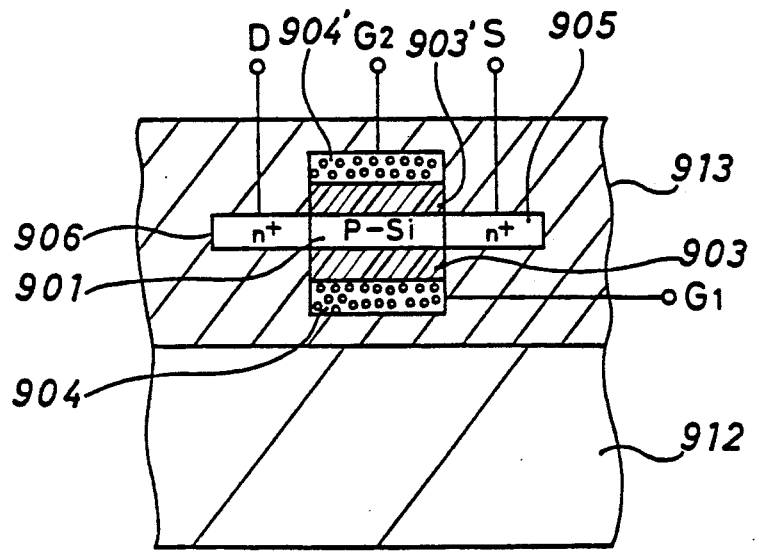
FIG. 9 is a cross-sectional view of a conventional MOS FET which is called an X-MOS.

FIGS. 6(a) to 6(c) show the structure of still another embodiment of a trench gate MOS FET according to the present invention, wherein FIG. 6(a) is a plan view thereof, FIG. 6(b) a sectional view taken in the lengthwise direction of the gate, along line A—A' of FIG. 6(a), and FIG. 6(c) a sectional view taken in the widthwise direction of the gate, along line B—B' of FIG. 6(a). This embodiment has a trench isolation and a trench gate. On the surface of an Si substrate 601, a trench isolation region 607 of SiO$_2$ is formed. In the trench gate region, an SiO$_2$ gate film 603 is formed in a trench and the trench is filled with an Si gate electrode 604 formed to extend above an SiO$_2$ field film 608 contiguous with region 607. Diffusion layers 605 and 606, which are to be a source and a drain, respectively, are formed with the trench gate therebetween in the lengthwise direction of the gate, i.e., the direction A—A'. The Si electrode 604 of the trench gate is in contact with the SiO$_2$ trench isolation 607, 608 in the widthwise direction of the gate, i.e., in the direction B—B'.

The present invention brings about the following advantages.

(1) Even if the depth of the trench of a trench gate MOS FET is made small, fluctuations in threshold voltage due to the trapping of hot electrons are prevented for a long period. Thus, the present invention is useful for miniaturization of an MOS FET.

(2) It is possible to enhance the switching speed and propagation speed owing to the reduction in the electric capacitance between the gate electrode and, above all, the drain diffusion layer of a trench gate MOS FET.

(3) In the case of an MOS FET having two gates (dual gate MOS FET) of the present invention, it is possible to reduce the short channel effect and sub-threshold effect and to reduce the channel length to about 0.02 μm due to the shield effect of one gate and miniaturizing effect brought about by reducing the width of silicon of the channel region. Use of single crystal Si eliminates crystal defects, thereby reducing the leakage current.

In performing the ion implantation operations described above with reference to the embodiments of FIGS. 1-6, the implanted impurity material may be, for example, P or As. For each n$^-$ layer, an impurity concentration of 0.5 to 5×10$^{13}$/cm$^2$ may be used, a specific exemplary value being 2×10$^{13}$/cm$^2$. For each n$^+$ layer, an impurity concentration of 1 to 5×10$^{15}$/cm$^2$ may be used, a specific exemplary value being 3×10$^{15}$/cm$^2$. In the embodiments illustrated in FIGS. 2-6, each implanted n$^-$ layer may have a depth of 0.05 to 0.15 μm, an exemplary value being 0.1 μm, and each implanted n$^+$ layer may have a depth of 0.15 to 0.5 μm, an exemplary value being 0.2 μm.

While there has been described what are at present considered to be preferred embodiments of the invention, it will be understood that various modification may be made thereto, and it is intended that the appended claims cover all such modifications as fall within the true spirit and scope of the invention.

What is claimed is:

1. In a trench gate MOS FET formed in a surface of a semiconductor substrate, the FET having: a trench formed in the surface of the substrate, the trench having a side wall; and a trench gate composed of a dielectric film on the side wall of the trench and an electrode on the dielectric film, the improvement wherein: said trench has a depth, perpendicular to the surface of said substrate, not greater than 0.5μ; and said FET further comprises a drain impurity diffusion region composed of a low impurity concentration layer adjacent said dielectric film, and a high impurity concentration layer adjacent said low impurity concentration layer, both of said layers extending from the substrate surface.

2. In a trench gate MOS FET formed in a surface of a semiconductor substrate, the FET having: a trench formed in the surface of the substrate, the trench having a side wall; a trench gate composed of a dielectric film on the side wall of the trench and an electrode on the dielectric film; and an impurity diffusion layer located at the surface of the substrate adjacent the trench, the improvement wherein said dielectric film has a greater thickness where it is adjacent said impurity diffusion layer than at a location below said impurity diffusion layer, and said trench has a depth, perpendicular to the surface of said substrate, no greater than 0.5μ.

3. In a trench gate MOS FET formed in a surface of a substrate, the substrate being of a first conductivity type, the FET having: a first trench formed in the surface of the substrate, the first trench having a side wall; and a first trench gate composed of a first dielectric film on the side wall of the first trench and a first electrode on the first dielectric film, the improvement wherein said FET further comprises: a second trench formed in the surface of said substrate and spaced from said first trench, said second trench having a side wall; a second trench gate composed of a second dielectric film on said side wall of said second trench and a second electrode on said second dielectric film; a third trench formed in the surface of said substrate and spaced from said second trench in a direction such that said second trench is located between said first trench and said third trench, and a body of dielectric material in said third trench; a first diffused region of a second conductivity type opposite to the first conductivity type formed in the surface of said substrate and extending between said first and second trench gates; a channel region in said substrate beneath said first diffused region and extending only between said first and second trench gates; and a second diffused region of the second conductivity type in said substrate, said second diffused region being composed of a first part located beneath said channel region and extending between said first and second trench gates, and a second part which extends between said second trench gate and said first trench and which is contiguous with said first part.

* * * * *